(12) United States Patent
Kim et al.

(10) Patent No.: US 10,048,919 B2
(45) Date of Patent: Aug. 14, 2018

(54) ACTIVE MATRIX ORGANIC LIGHT-EMITTING DIODE DISPLAY AND METHOD OF CONTROLLING DISPLAY THEREOF

(71) Applicant: Samsung Electronics Co., Ltd., Suwon-si, Gyeonggi-do (KR)

(72) Inventors: Jung Hyun Kim, Suwon-si (KR); Dong Sub Kim, Suwon-si (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 203 days.

(21) Appl. No.: 14/616,047

(22) Filed: Feb. 6, 2015

(65) Prior Publication Data

US 2015/0153992 A1    Jun. 4, 2015

Related U.S. Application Data

(63) Continuation of application No. 13/185,700, filed on Jul. 19, 2011, now Pat. No. 8,976,322.

(30) Foreign Application Priority Data

Aug. 6, 2010    (KR) .................. 10-2010-0075774

(51) Int. Cl.
*G09G 5/00*    (2006.01)
*G06F 3/14*    (2006.01)
(Continued)

(52) U.S. Cl.
CPC ........ *G06F 3/1431* (2013.01); *G02F 1/13473* (2013.01); *G02F 1/13718* (2013.01); *G06F 1/3206* (2013.01); *G06F 1/3265* (2013.01); *G09G 3/20* (2013.01); *G09G 3/3225* (2013.01); *G09G 3/3629* (2013.01); *H01L 27/3232* (2013.01); *G02F 2201/44* (2013.01); *G09G 2300/02* (2013.01); *G09G 2300/023* (2013.01);
(Continued)

(58) Field of Classification Search
CPC .. G09G 2300/023; G09G 3/3225; G09G 3/20; G09G 3/3629; G09G 2380/14; G09G 2360/144; G09G 2360/04; G09G 2330/021; G09G 2300/02; G06F 3/1431; G06F 1/3206; G06F 1/3265; G02F 1/13473; G02F 1/13718; H01L 27/3232

See application file for complete search history.

(56) References Cited

U.S. PATENT DOCUMENTS 6,927,765 B1    8/2005 Masazumi et al.
7,616,287 B2    11/2009 Nose et al.
(Continued)

FOREIGN PATENT DOCUMENTS

CN    1851539 A    10/2006
CN    1858840 A    11/2006
(Continued)

*Primary Examiner* — Jonathan Boyd
(74) *Attorney, Agent, or Firm* — Jefferson IP Law, LLP

(57) ABSTRACT

An method and apparatus are provided. The method includes, at an apparatus, determining a display mode to present content, selecting, based at least in part on the display mode, a display from a display module comprising a plurality of stacked displays, operatively coupled with the apparatus, and presenting at least a part of the content via the display.

22 Claims, 6 Drawing Sheets

(51) Int. Cl.
*G02F 1/1347* (2006.01)
*G02F 1/137* (2006.01)
*G09G 3/20* (2006.01)
*G09G 3/36* (2006.01)
*H01L 27/32* (2006.01)
*G06F 1/32* (2006.01)
*G09G 3/3225* (2016.01)

(52) U.S. Cl.
CPC ... *G09G 2330/021* (2013.01); *G09G 2360/04* (2013.01); *G09G 2360/144* (2013.01); *G09G 2380/14* (2013.01); *H01L 27/3267* (2013.01)

(56) References Cited

U.S. PATENT DOCUMENTS

| | | |
|---|---|---|
| 2001/0040542 A1 | 11/2001 | Harada et al. |
| 2004/0017523 A1 | 1/2004 | Asada |
| 2004/0090577 A1 | 5/2004 | Hara |
| 2004/0141120 A1 | 7/2004 | Faris et al. |
| 2005/0206804 A1 | 9/2005 | Hara |
| 2006/0050201 A1* | 3/2006 | Kato ............... G02F 1/133553 349/69 |
| 2006/0244702 A1 | 11/2006 | Yamazaki et al. |
| 2007/0076135 A1 | 4/2007 | Gomyou et al. |
| 2008/0309598 A1 | 12/2008 | Doane et al. |
| 2009/0091524 A1* | 4/2009 | Lomas ............... G09G 3/3611 345/87 |
| 2009/0108757 A1 | 4/2009 | Lee et al. |
| 2009/0195568 A1 | 8/2009 | Sjodin |
| 2010/0141689 A1* | 6/2010 | Johnson ............... G06F 3/1423 345/690 |
| 2010/0213443 A1 | 8/2010 | Sapochak et al. |
| 2010/0245221 A1 | 9/2010 | Khan |
| 2010/0302193 A1 | 12/2010 | Park et al. |
| 2011/0138207 A1* | 6/2011 | Su ............... G06F 1/1677 713/323 |

FOREIGN PATENT DOCUMENTS

| | | |
|---|---|---|
| JP | 2003-098984 A | 4/2003 |
| KR | 10-0826582 B1 | 4/2008 |
| KR | 10-2009-0099248 A | 9/2009 |
| KR | 10-2010-0030562 A | 3/2010 |

* cited by examiner

ACTIVE MATRIX ORGANIC LIGHT-EMITTING DIODE DISPLAY AND METHOD OF CONTROLLING DISPLAY THEREOF

PRIORITY

This is a continuation application for prior application Ser. No. 13/185,700, filed on Jul. 19, 2011, which claims the benefit under 35 U.S.C. § 119(a) of a Korean patent application filed on Aug. 6, 2010, in the Korean Intellectual Property Office and assigned Serial No. 10-2010-0075774, the entire disclosures of which are hereby incorporated by reference.

BACKGROUND OF THE INVENTION

1. Field of the Invention

The present invention relates to an Active Matrix Organic Light Emitting Diode (AMOLED) display and a method of controlling a display thereof. More particularly, the present invention relates to an AMOLED display and a method of controlling a display thereof that use a cholesteric Liquid Crystal Display (LCD) that can operate in a low power mode or a high picture quality mode.

2. Description of the Related Art

Nowadays, as a display used for a mobile terminal or an e-paper, an AMOLED display or a Liquid Crystal Display (LCD) are widely available. More particularly, an LCD is classified as a transmissive LCD, a reflective LCD, or a transflective LCD, according to a display method.

Because the transmissive LCD uses a backlight, a panel, and a line polarizing plate, the transmissive LCD has a low efficiency backlight, consumes a relatively large amount of current, and has low outdoor visibility. The AMOLED display that displays a screen without using external light has a high optical characteristic, but also consumes a relatively large amount of power.

The reflective LCD uses external light as a light source using a reflector, a panel, and a circular polarization plate, and has a reflexibility of less than 20%. Thus, the reflective LCD cannot display a screen at a location having a low indoor visibility and having no external light. The reflective LCD uses a cholesteric LCD, and a related art cholesteric LCD is described with reference to FIG. 1.

FIG. 1 is a perspective view illustrating a cholesteric LCD of the related art.

Referring to FIG. 1, a cholesteric LCD 10 includes an absorption layer 11, a first cholesteric liquid crystal color layer 12 in which a first transparent electrode film 15 is attached to an upper surface thereof, a second cholesteric liquid crystal color layer 13 in which a second transparent electrode film 16 is attached to an upper surface thereof, and a third cholesteric liquid crystal color layer 14 in which a third transparent electrode film 17 is attached to an upper surface thereof. The absorption layer 11, the first cholesteric liquid crystal color layer 12, the second cholesteric liquid crystal color layer 13, and the third cholesteric liquid crystal color layer are sequentially stacked. In the cholesteric LCD 10, power is required only when a state of one or more of the cholesteric liquid crystal color layers 12, 13, and 14 changes, and thus the cholesteric LCD 10 has bistability, very low power consumption, a low optical characteristic, and a slow response speed.

The transflective LCD has a portion operating as a reflective LCD and other portions operating as a transmissive LCD by disposing a reflector at a part of a pixel, and has a structure entailing a little lower transmitting characteristic and higher outdoor visibility than that of the transmissive LCD. However, because of the reflector, the transflective LCD has a reduced aperture ratio, resulting in low luminance, and a reduced color reproduction ratio. Further, in order to obtain a desired color reproduction ratio, reflexibility is limited to about 2% to 5%, and therefore it is difficult to apply a high specification of display and to apply AMOLED technology. Further, due to the expansion of the e-book market, a further limitation has become increasingly important in reducing the required power consumption.

SUMMARY OF THE INVENTION

Aspects of the present invention are to address at least the above-mentioned problems and/or disadvantages and to provide at least the advantages described below. Accordingly, an aspect of the present invention is to provide an Active Matrix Organic Light Emitting Diode (AMOLED) display and a method of controlling a display thereof that can operate as an AMOLED of a high picture quality when used in an indoor environment or when viewing a motion picture, and that can operate as a cholesteric Liquid Crystal Display (LCD) of super low power consumption when used in an outdoor environment or when using as an e-book reader.

In accordance with an aspect of the present invention, a method is provided. The method includes, at an apparatus, determining a display mode to present content, selecting, based at least in part on the display mode, a display from a display module comprising a plurality of stacked displays, operatively coupled with the apparatus, and presenting at least a part of the content via the display.

In accordance with another aspect of the present invention, an apparatus is provided. The apparatus includes a display module and a controller. The display module includes a plurality of stacked displays, operatively coupled with the apparatus. The controller is operatively coupled with the display module and configured to determine a display mode to present a content, to select, based at least in part on the display mode, a display from the plurality of stacked displays, and to present at least a part of the content via the display.

In accordance with yet another aspect of the present invention, a method is provided. The method includes, at an apparatus, determining a display mode based at least in part on an environment of the apparatus or a display operatively coupled with the apparatus, and presenting content via the display or one or more other displays operatively coupled with the apparatus, based at least in part on the display mode.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding, but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 2:
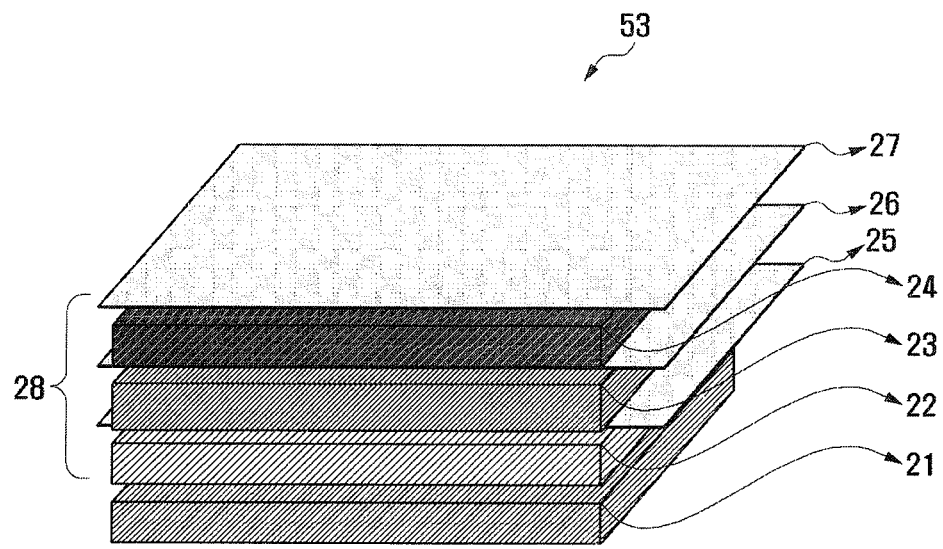
FIG. 2 is a perspective view illustrating a display unit of an Active Matrix Organic Light Emitting Diode (AMOLED) display according to an exemplary embodiment of the present invention.
Figure 3:
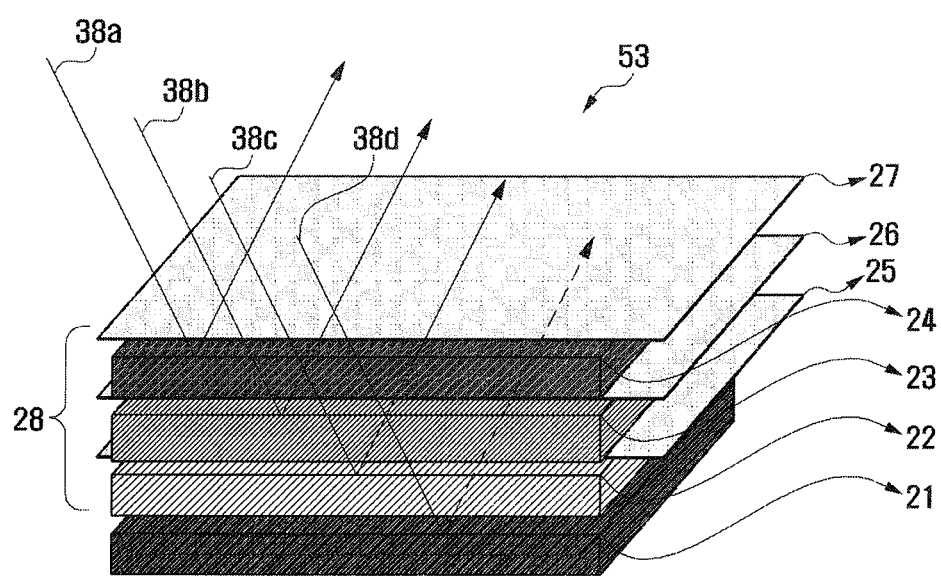
FIG. 3 is a diagram illustrating a low power mode operation of the display unit of FIG. 2 according to an exemplary embodiment of the present invention.
Figure 4:
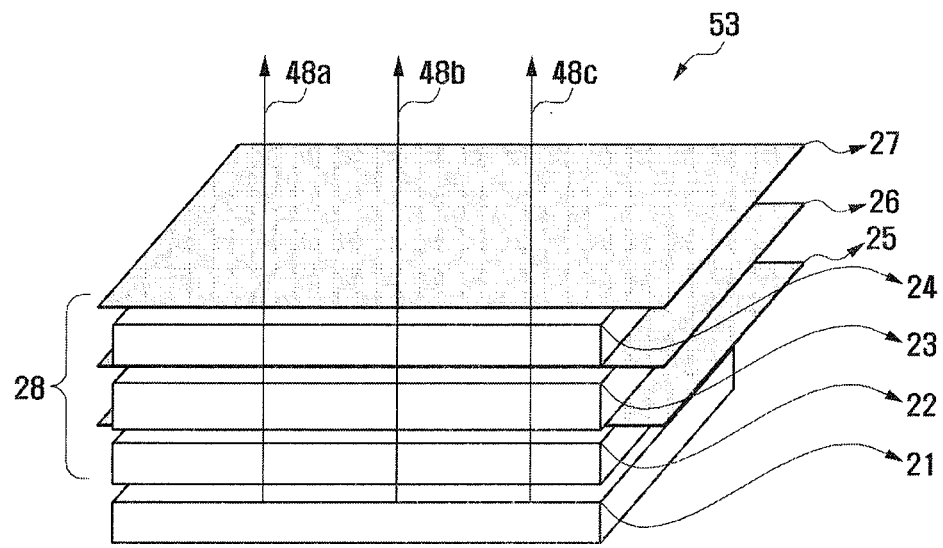
FIG. 4 is a diagram illustrating a high picture quality mode operation of the display unit of FIG. 2 according to an exemplary embodiment of the present invention.
Figure 5:
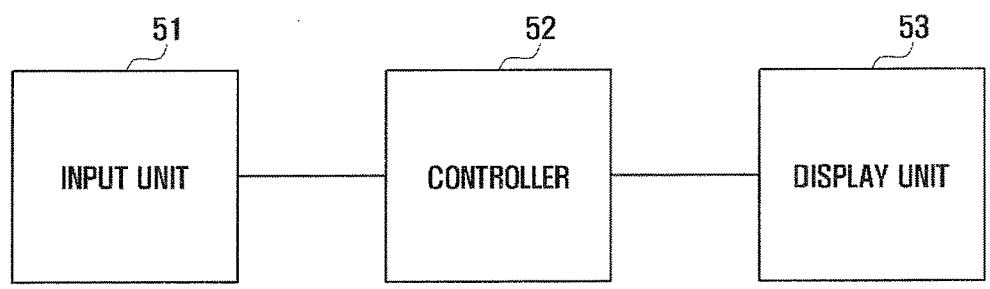
FIG. 5 is a block diagram illustrating a configuration of an AMOLED display according to an exemplary embodiment of the present invention.

FIG. 2 is a perspective view illustrating a display unit of an Active Matrix Organic Light Emitting Diode (AMOLED) display according to an exemplary embodiment of the present invention, FIG. 3 is a diagram illustrating a low power mode operation of the display unit of FIG. 2 according to an exemplary embodiment of the present invention, FIG. 4 is a diagram illustrating a high picture quality mode operation of the display unit of FIG. 2 according to an exemplary embodiment of the present invention, and FIG. 5 is a block diagram illustrating a configuration of an AMOLED display according to an exemplary embodiment of the present invention.

Referring to FIGS. 2 and 5, an AMOLED display according to an exemplary embodiment of the present invention is described.

The AMOLED display includes an input unit 51, a controller 52, and a display unit 53.

The input unit 51 inputs one of a low power mode and a high picture quality mode, and may be a touch pad or a keypad by which a user can select the mode, or a sensor that can automatically select the mode.

The controller 52 receives a low power mode input signal or a high picture quality mode input signal from the input unit 51, determines whether one of a low power mode and a high picture quality mode is input, outputs the low power mode control signal to the display unit 53 if the low power mode is input, and outputs a high picture quality mode control signal to the display unit 53 if the high picture quality mode is input. The controller of this exemplary embodiment may be formed as a microprocessor chip.

The display unit 53 displays a low power mode screen or a high picture quality mode screen and includes an AMOLED 21 and a cholesteric Liquid Crystal Display (LCD) 28.

The cholesteric LCD 28 includes a first cholesteric liquid crystal color layer 22 stacked at an upper surface of the AMOLED 21, a second cholesteric liquid crystal color layer 23 stacked at an upper part of the first cholesteric liquid crystal color layer 22, and a third cholesteric liquid crystal color layer 24 stacked at an upper part of the second cholesteric liquid crystal color layer 23.

Referring to FIG. 3, in the present exemplary embodiment, the first cholesteric liquid crystal color layer 22 selectively reflects or transmits blue color light 38c, the second cholesteric liquid crystal color layer 23 selectively reflects or transmits green color light 38b, and the third cholesteric liquid crystal color layer 24 selectively reflects or transmits red color light 38a. However, the present invention is not limited thereto, and one of the three cholesteric liquid crystal color layers 22, 23, and 24 can selectively reflect or transmit the red color light, another one can selectively reflect or transmit the green color light, and the remaining one can selectively reflect or transmit the blue color light.

A first transparent electrode film 25 is attached to an upper surface of the first cholesteric liquid crystal color layer 22, a second transparent electrode film 26 is attached to an upper surface of the second cholesteric liquid crystal color layer 23, and a third transparent electrode film 27 is attached to an upper surface of the third cholesteric liquid crystal color layer 24. The first transparent electrode film 25, the second transparent electrode film 26, and the third transparent electrode film 27 fix the first cholesteric liquid crystal color layer 22, the second cholesteric liquid crystal color layer 23, and the third cholesteric liquid crystal color layer 24, respectively, and perform a function of applying a voltage in order to reflect or transmit desired light. Further, in this exemplary embodiment the transparent electrode films 25, 26, and 27 are each made of Indium Tin Oxide (ITO), and a thickness thereof is preferably 0.05 μm to 0.12 μm.

Figure 1:
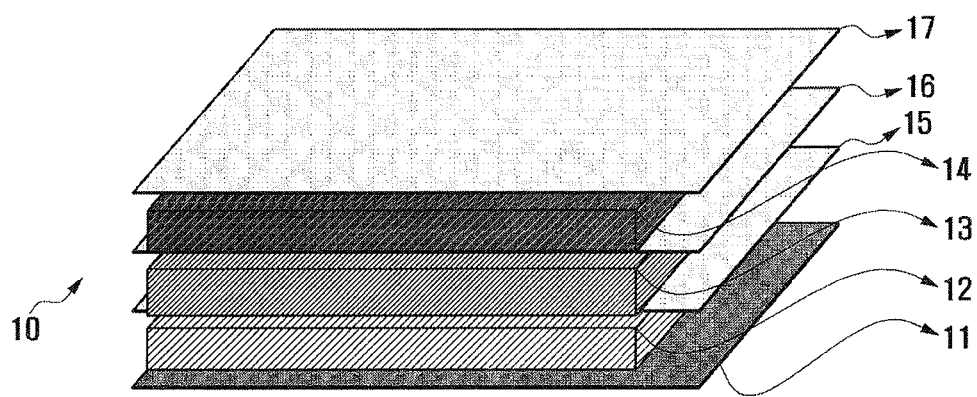
FIG. 1 is a perspective view illustrating a cholesteric Liquid Crystal Display (LCD) of the related art.

In a low power mode, the AMOLED 21 is turned off and performs a same function as that of the absorption layer 11 of FIG. 1. That is, because a black color cannot be expressed with only the cholesteric liquid crystal color layers 22, 23, and 24, an absorption layer for expressing a black color should exist, and when power is not supplied, a light emitting body does not operate and thus the AMOLED 21 theoretically completely becomes a black color and performs a function of an absorption layer that absorbs light 38d. Further, as the cholesteric LCD 28 is turned on, the first cholesteric liquid crystal color layer 22, the second cholesteric liquid crystal color layer 23, and the third cholesteric liquid crystal color layer 24 selectively reflect or transmit blue color light 38c, green color light 38b, and red color light 38a, respectively. Accordingly, the AMOLED display can operate as a low power cholesteric LCD.

Referring to FIG. 4, a high picture quality mode operation of the display unit 53 of FIG. 2 is described. In a high picture quality mode, as the cholesteric LCD 28 is turned off, the first cholesteric liquid crystal color layer 22, the second cholesteric liquid crystal color layer 23, and the third cholesteric liquid crystal color layer 24 continue to transmit unfiltered all color light, i.e., all red color light 48a, green color light 48b, and blue color light 48c. Further, as the AMOLED 21 is turned on, power is supplied and thus the AMOLED 21 is driven. Because the AMOLED 21 is formed by coating a kind of film (not shown) on a light emitting body, when external light is strong such a film can function as a reflector. Therefore, in order to prevent strong external light from being reflected, it is necessary to attach a circular polarization plate to an upper part thereof. In the AMOLED display according to the present exemplary embodiment, the cholesteric liquid crystal color layers 22, 23, and 24 can perform a function of a circular polarization plate. More particularly, when a cholesteric liquid crystal cell has a thickness of 14 μm or more, right circular polarized light can be totally reflected and thus it is preferable that at least one of three cholesteric liquid crystal color layers 22, 23, and 24 has each a thickness of 14 μm or more.

According to the present exemplary embodiment, by stacking three cholesteric liquid crystal color layers 22, 23, and 24 at an upper part of the AMOLED 21, when used in an indoor environment or when viewing a motion picture, the AMOLED 21 can operate as a high picture quality AMOLED, and when used in an outdoor environment or as an e-book reader, the AMOLED 21 can operate as a cholesteric LCD of super low power. Further, because the AMOLED 21 of the present exemplary embodiment has a structure in which a circular polarization plate of an AMOLED display of the related art is replaced with a cholesteric LCD in which an absorption layer is removed instead of a simple combination of an AMOLED display of the related art and a conventional cholesteric LCD of the related art, a thickness and cost of the AMOLED 21 can be reduced further than those of a simple combination of a AMOLED of the related art display and a cholesteric LCD of the related art.

Figure 6:
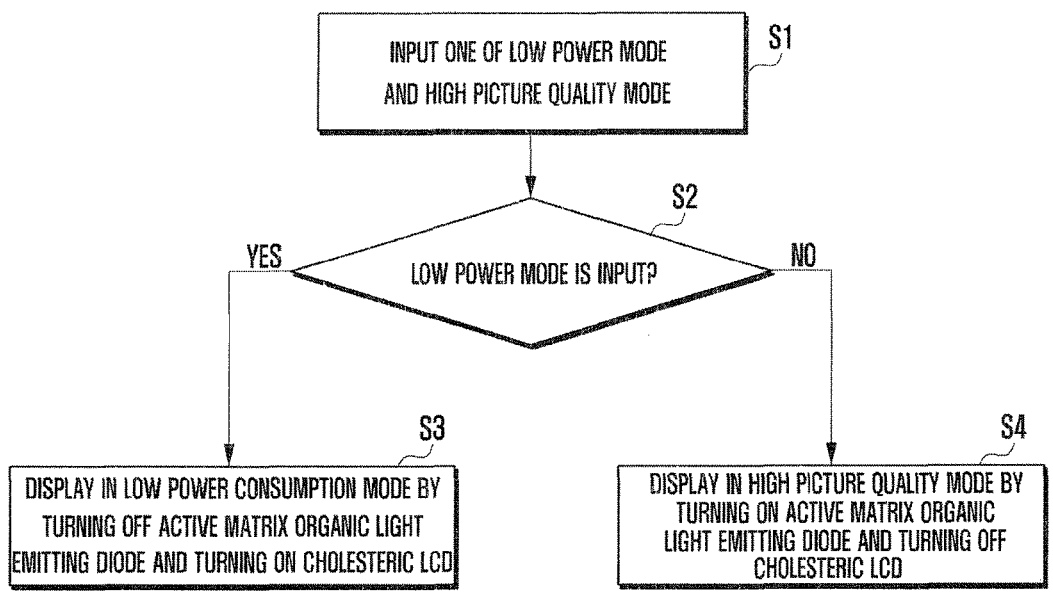
FIG. 6 is a flowchart illustrating a method of controlling a display of the AMOLED display of FIG. 5 according to an exemplary embodiment of the present invention.

FIG. 6 is a flowchart illustrating a method of controlling a display of the AMOLED display of FIG. 5 according to an exemplary embodiment of the present invention.

Referring to FIGS. 2 to 6, a method of displaying an AMOLED display according to an exemplary embodiment of the present invention is described.

First, one of a low power mode and a high picture quality mode is input by the input unit 51 at step S1.

The controller 52 determines whether a low power mode is input at step S2.

If it is determined that the low power mode is input, the controller 52 controls the display unit 53 to display in the low power mode by turning off the AMOLED 21 and turning on the cholesteric LCD 28 at step S3.

If it is determined that the low power mode is not input, i.e., if it is determined that the high picture quality mode is input at step S2, the controller 52 controls the display unit 53 to display in the high picture quality mode by turning on the AMOLED 21 and turning off the cholesteric LCD 28 at step S4.

In this way, in a method of controlling a display of an AMOLED display according to the present exemplary embodiment, because a low power mode screen or a high picture quality mode screen can be displayed according to an input, an appropriate mode screen can be displayed according to a user environment or a user viewing image.

As described above, according to an exemplary embodiment of the present invention, when used in an indoor environment or when viewing a motion picture, an AMOLED display may operate as an AMOLED of a high picture quality, and when used in outdoor environment or as an e-book reader, the AMOLED display can operate as a cholesteric LCD of super low power.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method comprising:
   determining, at an apparatus, a display mode based on a type of a content;
   selecting, based at least in part on the display mode, at least one display from a display module comprising a plurality of stacked displays, operatively coupled with the apparatus; and
   presenting at least a part of the content via the selected at least one display,
   wherein the display mode is selected from among a plurality of display modes including a high quality display mode and a low power display mode.

2. The method of claim 1, wherein the determining of the display mode is based at least in part on the content.

3. The method of claim 1, wherein the determining of the display mode comprises determining another display mode to present another content, based at least in part on the other content.

4. The method of claim 3, further comprising selecting, based at least in part on the other display mode, another display from the plurality of stacked displays.

5. The method of claim 4, wherein the other content is presented via the other display when the content is displayed via the display.

6. The method of claim 4, wherein the presenting comprises presenting the other content via the display and the other display.

7. The method of claim 1, wherein the determining of the display mode comprises determining the display mode based at least in part on an environment associated with the display or the apparatus.

8. The method of claim 1, wherein the display mode is determined based at least in part on a power state of the display or of the apparatus.

9. The method of claim 1, wherein the selecting comprises receiving user input to select the display mode.

10. The method of claim 1, wherein the high quality display mode comprises selecting a display so as to have a faster response time than a response time of a display of the low power display mode.

11. The method of claim 1, wherein the high quality display mode comprises selecting a display so as to have a higher color reproduction ratio than a color reproduction ratio of a display of the low power display mode.

12. The method of claim 2, wherein the high quality display mode is selected if the content comprises a motion picture.

13. The method of claim 2, wherein the low power display mode is selected if the content comprises an e-book.

14. An apparatus comprising:
    a display module comprising a plurality of stacked displays, operatively coupled with the apparatus; and a controller operatively coupled with the display module, the controller configured to:
    determine a display mode based on a type of a content;
    select, based at least in part on the display mode, at least one display from the plurality of stacked displays; and
    present at least a part of the content via the selected at least one display,
wherein the display mode is selected from among a plurality of display modes including a high quality display mode and a low power display mode.

15. The apparatus of claim 14, wherein the plurality of stacked displays is configured to:
present a first content via a first display, and
present a second content via a second display through the first display.

16. The apparatus of claim 15, wherein the display module comprises at least one color layer between the first display and the second display.

17. The apparatus of claim 14 wherein the controller is further configured to determine at least one of the low power mode and the high quality mode as the display mode, based at least in part on the content.

18. The apparatus of claim 14, wherein the plurality of stacked displays comprises a first display operable in a first display mode and a second display operable in a second display mode.

19. The apparatus of claim 14, wherein the controller is further configured to determine another display mode to present another content, based at least in part on the other content.

20. The apparatus of claim 19, wherein the controller is further configured to select, based at least in part on the other display mode, another display from the plurality of stacked displays.

21. The apparatus of claim 14, wherein the controller is further configured to determine the display mode based at least in part on an environment associated with the display or the apparatus.

22. The apparatus of claim 14, wherein the controller is further configured to determine the display mode based at least in part on a power state of the display or of the apparatus.

* * * * *